United States Patent [19]

Chou

[11] Patent Number: 5,461,246
[45] Date of Patent: Oct. 24, 1995

[54] PHOTODETECTOR WITH FIRST AND SECOND CONTACTS

[75] Inventor: Stephen Y. Chou, Golden Valley, Minn.

[73] Assignee: Regents of the University of Minnesota, Minneapolis, Minn.

[21] Appl. No.: 241,622

[22] Filed: May 12, 1994

[51] Int. Cl.$^6$ .................................................. H01L 27/14
[52] U.S. Cl. ........................ 257/449; 257/457; 257/459; 257/453
[58] Field of Search ................... 257/459, 449, 257/457, 453, 454, 455, 456

[56] References Cited

U.S. PATENT DOCUMENTS

| 3,939,555 | 2/1976 | Jantsch et al. | 257/459 X |
| 4,626,883 | 12/1986 | Kash et al. | 257/459 X |
| 5,332,918 | 7/1994 | Smith et al. | 257/459 X |

FOREIGN PATENT DOCUMENTS

| 5553466 | 4/1980 | Japan | 257/457 |
| 1082358 | 9/1967 | United Kingdom | 257/453 |

OTHER PUBLICATIONS

Sand, "Two–Dimensional Ensemble Monte Carlo Calculation of Pulse Responses of Submicrometer GaAs Metal–Semiconductor–Metal Photodetectors", IEEE Transactions on Electron Devices, vol. 38, No. 9, Sep. 1991, pp. 2075–2081.

Ioannou et al., "A Fine–Line–Spot–Position (FLSP) Sensitive Photodetector," IEEE Transactions on Electron Devices, vol. ED–34, No. 4, Apr. 1987, pp. 778–781.

Chou et al, "Nanoscale Tera–Hertz Metal–Semiconductor–Metal Photodetectors", IEEE Journal of Quantum Electronics, vol. 28, No. 10, Oct. 1992, pp. 2358–2368.

Chou et al., "32 GHz metal–semiconductor–metal photodetectors on crystalline silicon", Appl. Phys. Lett, 61 (15) 12 Oct. 1992, 1992 American Institute of Physics, pp. 1760–1762.

Primary Examiner—William Mintel
Attorney, Agent, or Firm—Westman, Champlin & Kelly

[57] ABSTRACT

A metal-semiconductor-metal (MSM) photodetector in a silicon substrate. An insulating layer overlies the silicon substrate. An active layer is carried on the insulating layer and is separated from the silicon substrate. The active layer has an active layer thickness. Interdigitated fingers are carried on the active layer. The interdigitated fingers develop a potential therebetween related to incident radiation. Spacing between the interdigitated fingers is related to thickness of the active layer.

12 Claims, 5 Drawing Sheets

PHOTODETECTOR WITH FIRST AND SECOND CONTACTS

The United States Government has certain rights in this invention pursuant to Grant Number NSF/ECS-9120527 awarded by the NSF and Grant Number DA/DAAL03-90-G0058 award by the Department of the Army Research Office.

BACKGROUND OF THE INVENTION

The present invention relates to photodetectors. More specifically, the present invention relates to ultra-fast metal-semiconductor-metal (MSM) photodetectors.

Photodetectors are becoming increasingly important in modern electrical systems. These detectors are used in communication systems where information is transmitted in the form of light pulses along an optical fiber. In addition to the area of communications, such detectors are also used to read back optically stored information such as that stored on optical disks. Further, photodetectors can be used in high speed sampling, millimeter wave generation, remote sensing and generally to detect radiation. The speed of operation of the detector is crucial in determining the speed at which the detector can receive information.

Typically, photodetectors are fabricated using a material which generates charge carriers in response to incident radiation, such as from an optical communication signal. A plurality of interdigitated metal "fingers" are deposited on the material and connected to electrical contacts. A bias voltage is applied between the fingers. Current flow between the fingers is determined by the incident radiation. Current flow is detected and amplified.

These structures and their fabrication are described in "Nanoscale Tera-Hertz Metal-Semiconductor-Metal Photodetectors," by Stephen Y. Chou and Mark Y. Liu, published in the *IEEE Journal of Quantum Electronics*, Vol. 28, No. 10, October 1992.

Metal-semiconductor-metal (MSM) photodiodes are a family of fast, high-sensitivity detectors. Their simple planar structures enable easy fabrication in a process compatible with typical planar circuit technology. Hence, these structures are attractive for use in integrated opto-electronic systems. In the past, most attention was given to MSM diodes made on III-V substrates. Detectors fabricated in GaAs had speed, measured to the full width at half maximum (FWHM) of the response transient, as fast as 0.87 ps.

Although gallium arsenide-based photodetectors provide relatively fast response, it is preferable to fabricate devices in silicon. Silicon is a widely used semiconductor and easily implemented using present-day fabrication techniques. Further, typical silicon fabrication techniques tend to be less expensive than those of gallium arsenide. The Article, "32 HGz Metal-Semiconductor-metal Photodetectors on Crystalline Silicon," by Stephen Y. Chou, Yue Liu and T. F. Carruthers, published in *Applied Physics Letters*, 61 (15) on Oct. 12, 1992, by the American Institute of Physics, describes the fabrication of photodetectors in silicon.

However, preliminary results on 1.2 µm and 300 nm silicon diodes measured with colliding pulse lasers (wavelength of about 620 nm) indicated much slower response (14 and 11 ps, respectively) than the III-V compound semiconductor detectors.

In addition, these silicon devices had a long "tail" response, a residual electron drift component past the main peak. The tail response was as long as 1.4 ns for the 1.2 µm diodes. The tail is a particularly undesirable feature for practical applications. Because photoconductive current is cumulative, the device has to fully recover to its original, nonconductive state before the next optical pulse can be detected. This recovery period limits the speed of the device to less than 1 Gb/s. The speed of these devices became slower as the wavelengths of radiation become longer. At longer wavelengths, the devices lacked sufficient speed to be useful, particularly for applications such as telecommunications.

Thus, silicon photodetectors have not achieved the levels of performance which a simplified theory predicted.

SUMMARY OF THE INVENTION

It was discovered that the reason the prior art detectors did not meet expected performance levels was because the penetration depth of long wavelength incident radiation in materials limited the speed of the device. At long wavelength radiation, charge carriers are produced deep in these materials. These deep carriers take a relatively long time to diffuse vertically to reach a finger in comparison to carrier drift between fingers in the lateral direction. This caused the long "tail" in device response. The present invention isolates charge carriers generated relatively deep in the structure from the finger electrodes. Therefore, the electrodes only collect the charge which is close by. This increases the speed of the photodetector.

A photodetector detects a light signal and provides an electrical output. The photodetector includes a substrate layer and an electrical insulating layer deposited over the substrate layer. An active layer is deposited on the insulating layer and is separated from the substrate layer by the isolating layer. The active layer has an active layer thickness. A plurality of interdigitated conductive fingers overlie the active layer. The interdigitated fingers are spaced apart in the lateral dimension by a finger spacing. In one preferred embodiment, tile finger spacing is related to the thickness of the active layer.

The insulating layer provides a barrier to carriers generated deeper than the active layer. In one embodiment, the thickness of the active layer is selected such that the diffusion time of carriers in the vertical direction is the same as the drift time in the lateral direction.

DETAILED DESCRIPTION OF THE PREFERRED EMBODIMENTS

Metal-semiconductor-metal (MSM) photodetectors are very attractive for many optoelectronics applications, such as optical communication, future high-speed chip-to-chip connection, and high-speed sampling. Recently, 510 GHz MSM photodetectors on low-temperature-grown (LT) GaAs and 110 GHz on bulk silicon have been achieved. However, the response time of silicon MSM photodiodes is wavelength dependent and fast response achieved only at short wavelengths (about 500 nm). At long wavelengths, such as that of GaAs lasers (about 800 nm), their bandwidth dropped to approximately 40 GHz. It has been discovered that this is because it takes a relatively long time to collect the photogenerated carriers that are deep inside the semiconductor. This wavelength dependence of the response and the slow speed at long wavelengths impose serious limitations to typical silicon photodetector applications.

To solve this problem, the present invention provides MSM photodetectors in a thin silicon-on-insulator (SOI) substrate. A layer of buried oxide separates a thin top silicon layer from the bulk silicon substrate. By fabricating MSM photodetectors in the thin top silicon layer, the carriers generated deep inside the bulk substrate are isolated from the active region by the buried oxide. Therefore, these deep carriers do not affect the speed of the detector. In one embodiment, the thickness of the top silicon layer is chosen to so that the carrier diffusion time from the bottom surface of the thin silicon layer to the metal fingers on the front surface becomes comparable to that of the carrier transit time between the metal fingers.

In addition to the high speed, the present detector structure has three more advantages. First, the detector speed becomes independent of light penetration depth, and therefore independent of the light wavelength. Second, silicon-on-insulator MSM photodetectors have smaller device capacitance than bulk silicon detectors due to the oxide layer. This allows a smaller RC constant and hence a higher possible device speed. Finally, it has been demonstrated that silicon-on-insulator is suitable for high speed nanoscale FET-based circuits. Therefore, integration of silicon-on-insulator MSM photodetectors with silicon-on-insulator high speed circuits makes high speed silicon-on-insulator optical receivers possible.

Figure 1:
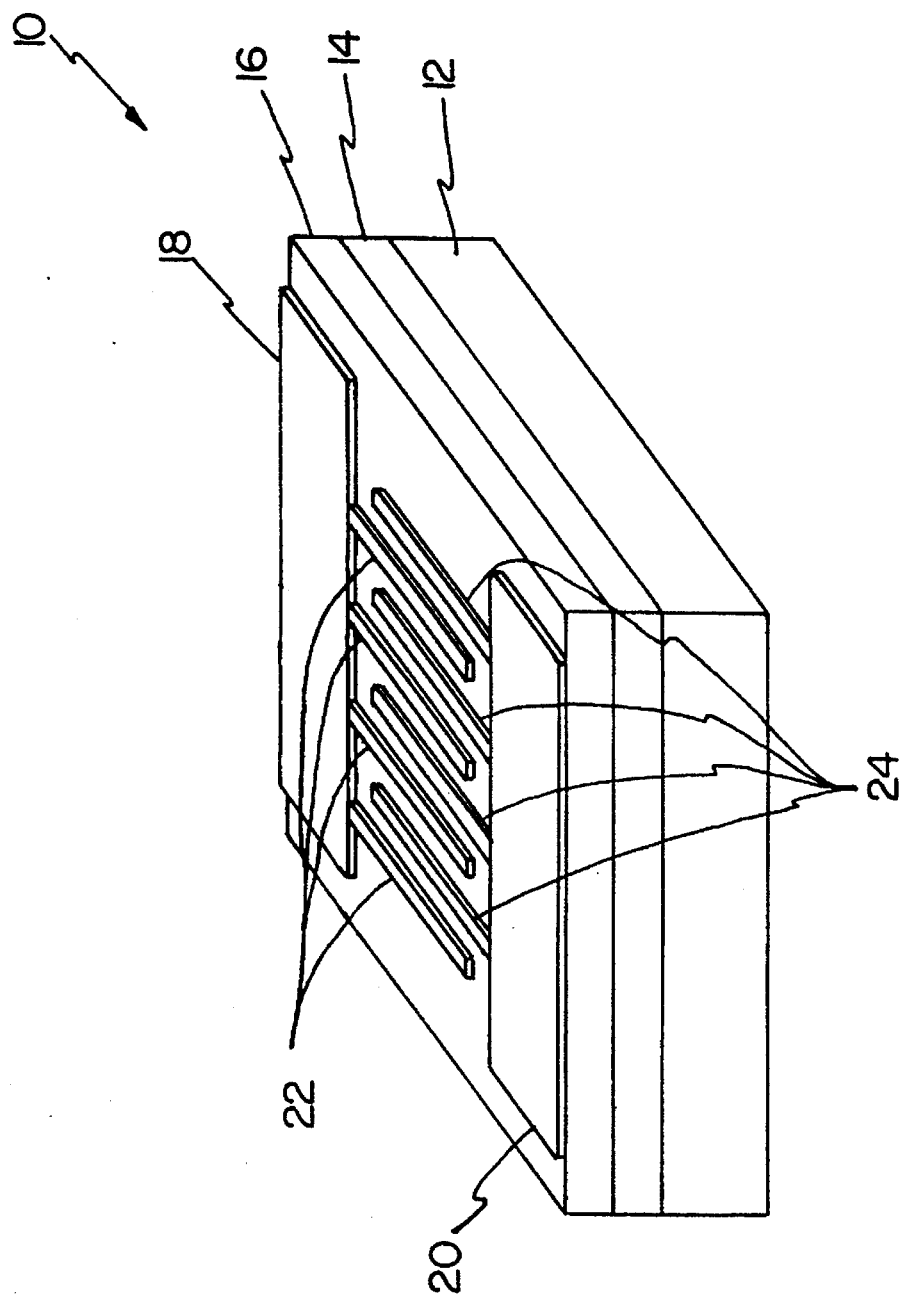
FIG. 1 is a perspective view of a photodetector in accordance with the present invention.

FIG. 1 shows a perspective cross-sectional view of metal-semiconductor-metal photodetector 10 in accordance with the invention. Detector 10 includes substrate 12, insulating layer 14, and active layer 16. Deposited upon active layer 16 is first contact 18 and second contact 20. Contact 18 connects to metal electrode fingers 22. Contact 20 connects to metal electrode fingers 24. Fingers 22 and 24 are interdigitated and have a finger width. Fingers 22 and 24 are spaced apart by a finger spacing.

In one embodiment, substrate 12 and active layer 16 comprise silicon. However, substrate 12 can be of any suitable material and active layer 16 can be any photosensitive material such as conducting polymers and optical polymers. Isolation layer 14 should be formed of electrical insulator, for example oxide, but can comprise any suitable insulator such as silicon dioxide, silicon nitride or other insulating polymers and ceramics or an air gap. In one preferred embodiment, fingers 22 and 24 form Schottky barriers with layer 16 and may comprise a platinum gold alloy or a titanium gold alloy.

In one embodiment, silicon-on-insulator detector 10 was fabricated on commercial SIMOX (Separation by Implanted Oxygen) wafers. Layer 16 is a p-type silicon of a doping concentration of $10^{15} cm^{-3}$ having a thickness of 100 nm. Layer 16 was thinned by 100 nm through oxidation and oxide strip-off in HF. The thickness of the buried oxide layer 14 is 370 nm. Interdigitated electrode fingers 22 and 24 have spacing and width of 100 nm. Fingers 22 and 24 were fabricated using electron beam lithography and a lift-off technique. Detector 10 has active layer 16 of 5 by 5 µm and a capacitance of 8 fF. Coplanar fingers 22 and 24 with 10 µm gap and 20 µm linewidth were integrated on detector 10 using photolithography. Fingers 22 and 24 are coupled to a transmission line (not shown) to detect incident radiation. The impedance of the transmission line used was about 60 Ω, so the estimated RC time constant is only 0.5 ps.

Figure 2:
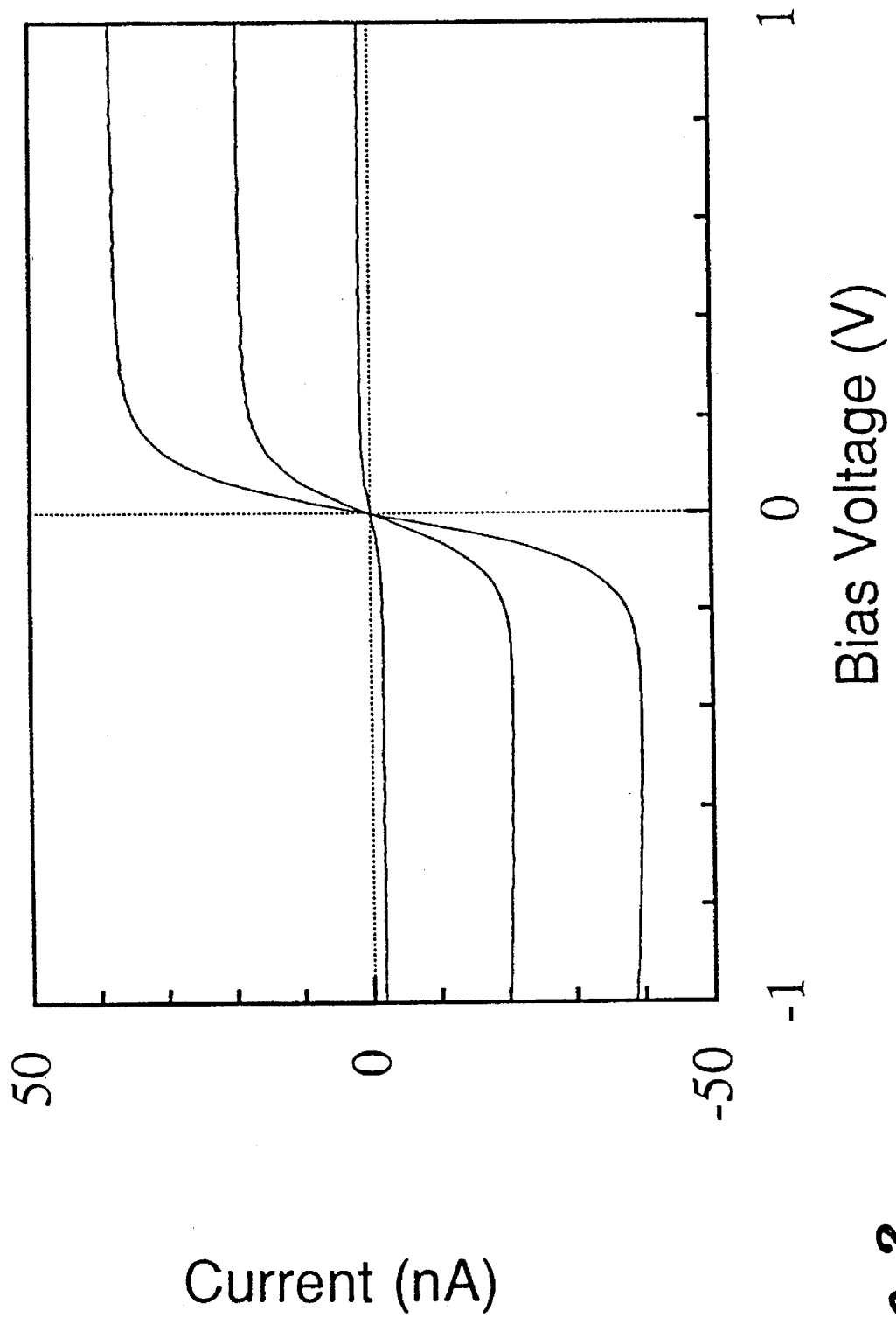
FIG. 2 is a graph showing electric current versus bias voltage for the photodetector of FIG. 1.

FIG. 2 is a graph of current in nanoamps versus bias voltage in volts for detector 10 shown in FIG. 1. FIG. 2 shows the device dc current-voltage characteristics at two different levels of incident radiation. Detector 10 demonstrates a good current saturation and a low dark current. From the Richardson thermionic emission equation and a Richardson constant of 30 $A/(cm^2K^2)$ for a p-type silicon substrate, the Schottky barrier height can be calculated to be 0.71V.

Figure 3:
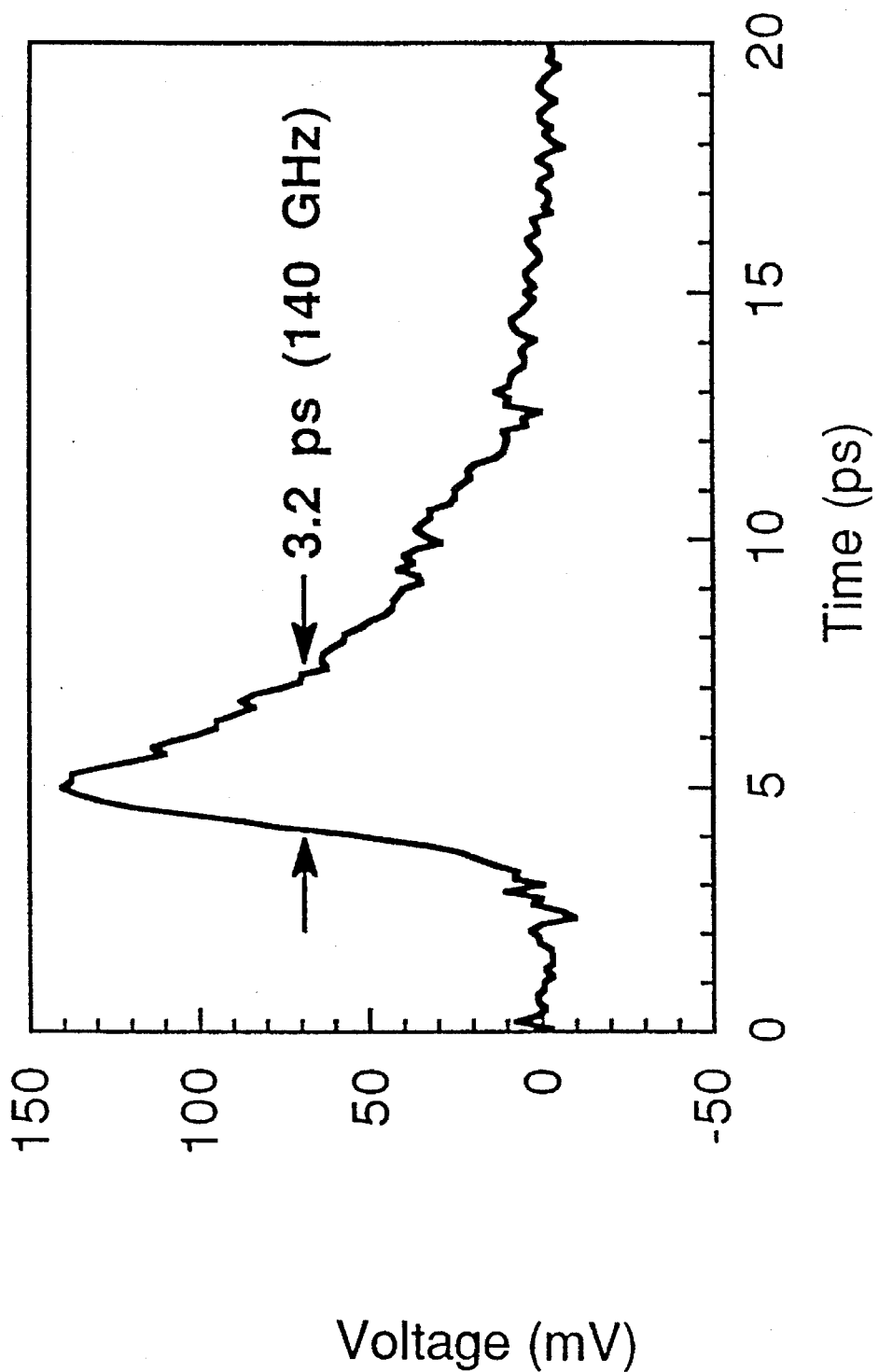
FIG. 3 is a graph showing the impulse response of the photodetector of FIG. 1.

Detector 10 was measured using an electrooptic sampling system and a pulsed $Ti:Al_2O_3$ laser. The laser had a pulse width of 100 fs and a wavelength of 780 nm. FIG. 3 shows the impulse response of detector 10 with a full width at half maximum (FWHM) of 3.2 ps, corresponding to a 3-db bandwidth of 160 GHz. Unlike the impulse response of the MSM photodiode in bulk silicon that has a long tail due to the photo-generated carriers generated deep inside the semiconductor bulk, the response curve of the silicon-on-insulator an MSM photodetector shows a very short tail of only about 10 ps. This is attributed to the thin silicon active layer 16 in the silicon-on-insulator structure.

The measured 3.2 ps response time agrees fairly well with one-dimensional (1-D) Monte Carlo simulation results, indicating that the response of the detector is mainly attributed to the carrier transit (drift) time between metal fingers 22 and 24, not the carrier diffusion time. To make detector 10 even faster, a smaller finger spacing and a thinner top active layer may be used simultaneously. Using the Monte Carlo simulation and assuming a 1-D model is valid when the finger spacing is reduced to 25 nm, silicon-on-insulator MSM photodetectors can have a response time as small as 1 ps and a bandwidth as high as 400 GHz. However, this requires that the active silicon layer thickness be reduced to 25 nm, leading to a significant reduction in sensitivity.

Figure 4:
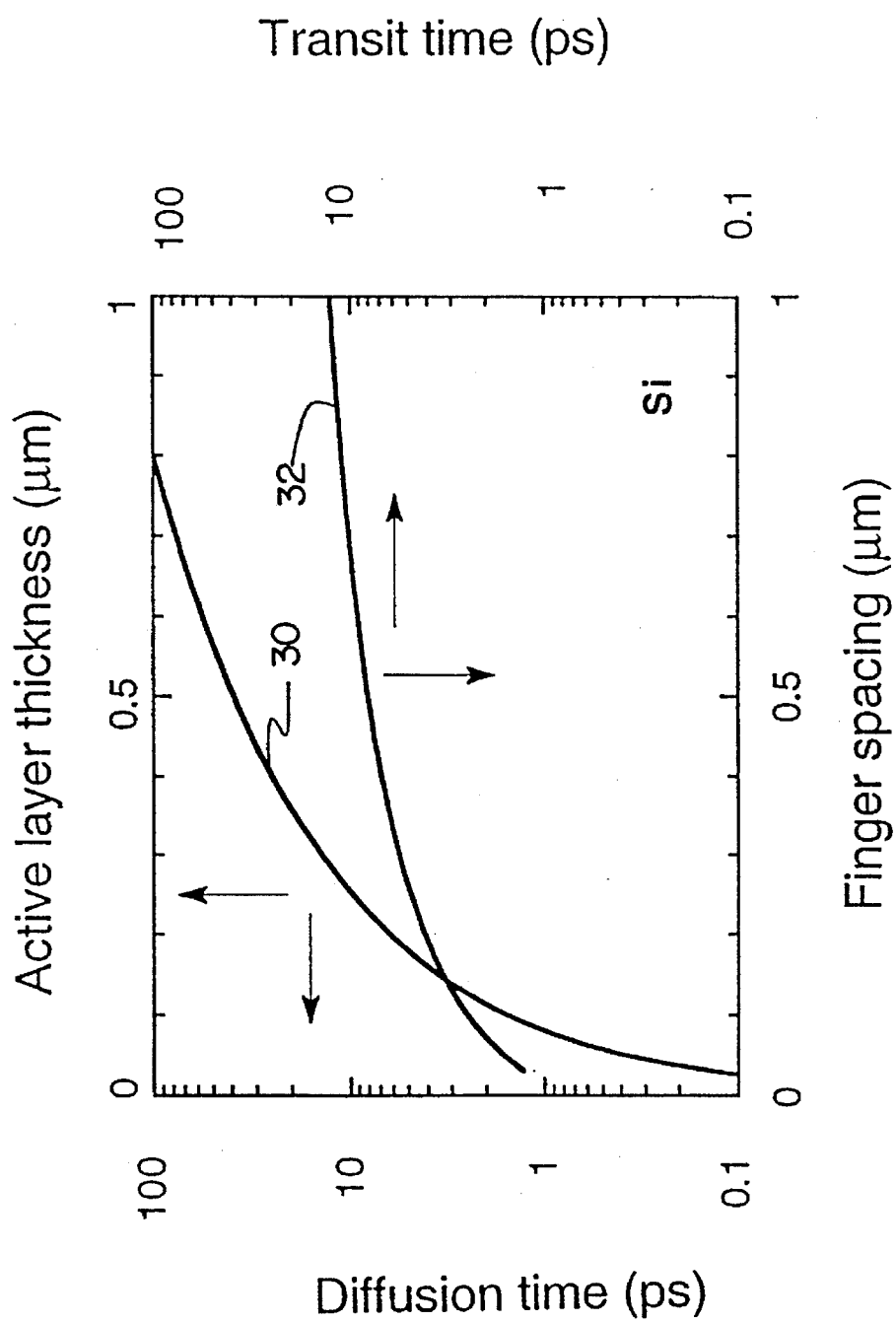
FIG. 4 is a graph showing the relationship between active layer thickness versus diffusion time and finger spacing versus transit time for the photodetector of FIG. 1.

FIG. 4 is a graph of diffusion time versus active layer thickness and transit time versus finger spacing for silicon. Curve 30 is a graph of the thickness of active layer 16 versus diffusion time. Diffusion is the mechanism largely responsible for movement of electrons in the horizontal direction through active layer 16 to fingers 22 and 24. Curve 32 shows transit time versus the spacing between fingers 22 and 24. Movement of electrons in the lateral direction across active layer 16 between pairs of fingers 22 and 24 (drift) is largely due to the applied bias voltage.

Thus, optimum device performance can be achieved by balancing diffusion time in the vertical direction, which is dependent on active layer thickness, with the transit time in the lateral direction, which is dependent on the finger spacing. The point at which curves 30 and 32 cross yields an optimum relationship between finger spacing and active layer thickness. As shown in FIG. 4, for the device which was graphed, the optimum finger spacing and active layer thickness occurs at about 0.15 µm. Typically, the thickness of active layer 16 should be much less than the light penetration depth for a given wavelength into the layer. The buried insulating layer 14 acts as an electron barrier to cut off carriers which are generated deep in the semiconductor substrate 12. The speed of the photodetector becomes faster and can also be made relatively independent of wavelength of the incident radiation.

Figure 5:
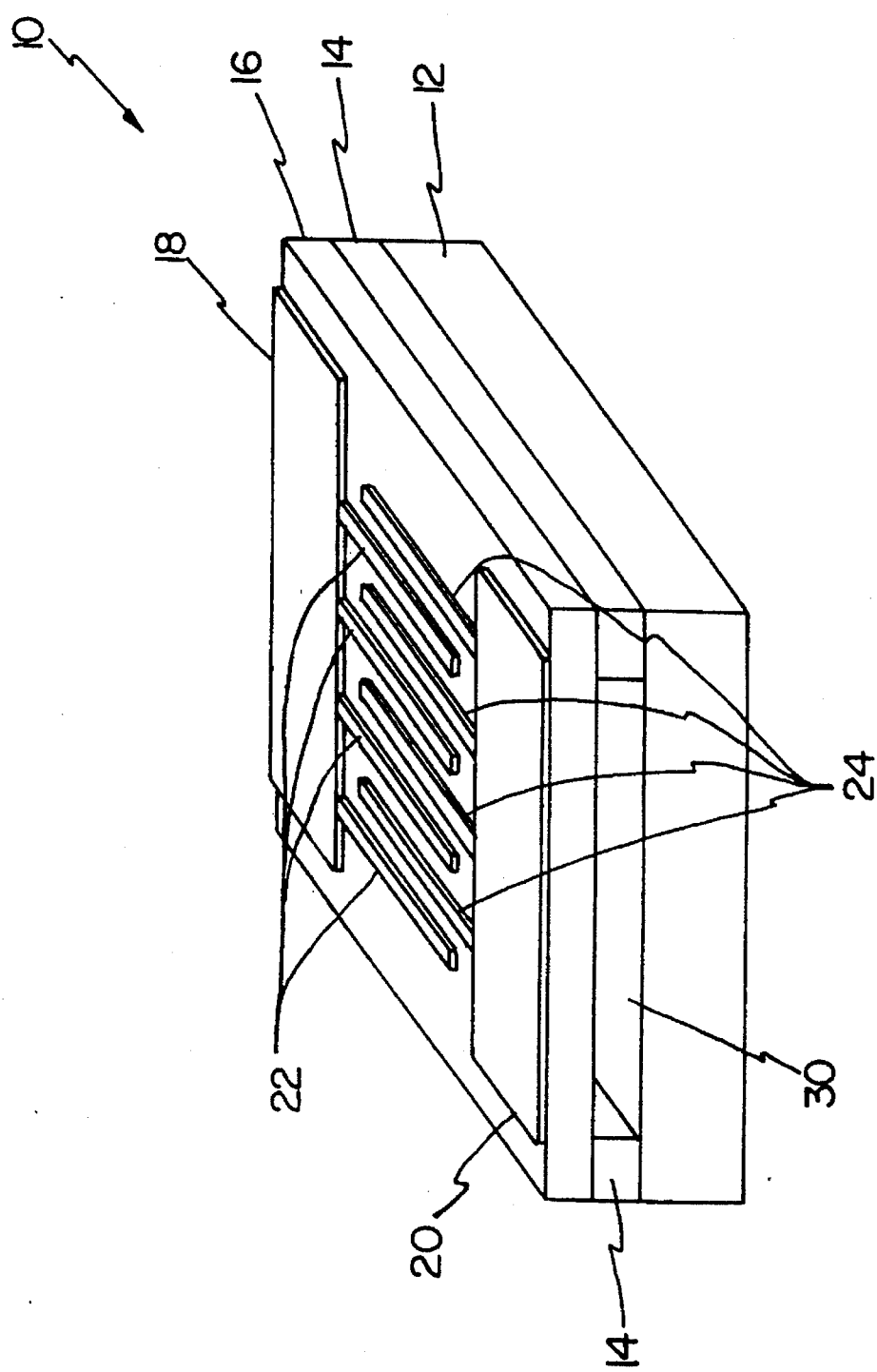
FIG. 5 is a perspective view of a photodetector in accordance with another embodiment of the present invention.

FIG. 5 shows another embodiment of the present invention. In FIG. 5, active layer 16 is suspended on each side by insulating layer 14. A space 30 is formed between insulating layer 16 and substrate 12 where insulating layer 14 has been removed. Standard masking and etching techniques can be used to strip the photoresist. Cavity 30 acts as an insulator similar to insulating layer 14, as described above.

Although the present invention has been described with reference to preferred embodiments, workers skilled in the art will recognize that changes may be made in form and detail without departing from the spirit and scope of the invention. For example, any type of suitable contact can be used to receive the optically generated carriers and the invention is not limited to interdigitated fingers.

What is claimed is:

1. A photodetector for detecting incident radiation and responsively providing an electrical output, the photodetector comprising:

a thin active semiconductor layer extending in a lateral direction which generates charge carriers in response to incident radiation, the active layer having a thickness in a vertical direction;

an electrical insulating layer coupled to the thin active layer;

a first electrical contact overlying the active layer opposite the electrical insulating layer;

a second electrical contact overlying the active layer opposite the electrical insulating layer and spaced apart in the lateral direction from the first electrical contact whereby the electrical output appears between the first and second contacts in response to carriers generated in the thin active layer; and wherein spacing between the contacts and thickness of the thin active layer is selected such that carrier drift time in the lateral direction between contacts is approximately equal to carrier diffusion time in the vertical direction.

2. The photodetector of claim 1 wherein the first electrical contact comprises a first plurality of fingers extending in the lateral direction and the second electrical contact comprises a second plurality of fingers extending in the lateral direction interdigitated with the first plurality of fingers.

3. The photodetector of claim 1 wherein at least one of the electrical contacts forms a Schottky barrier with the thin active layer.

4. The photodetector of claim 1 wherein the thin active layer comprises silicon.

5. The photodetector of claim 1 wherein the active layer thickness is about the same as the spacing between the contacts.

6. The photodetector of claim 1, wherein the electrical insulating layer comprises an oxide layer.

7. A photodetector for providing an electrical output representative of incident radiation, comprising:

a substrate layer extending in a lateral direction;

an electrical insulating layer deposited upon the substrate layer;

an active layer deposited upon the insulating layer and separated from the substrate layer by the insulating layer, the active layer having a thickness;

a first and a second electrical contact spaced apart in the lateral direction which develop an electrical signal therebetween related to incident radiation, wherein the thickness of the active layer is related to the spacing between the first and second contacts and is less than the penetration depth of the incident radiation whereby detector speed is substantially independent of light wavelength.

8. The photodetector of claim 7 wherein the first electrical contact comprises a first plurality of fingers extending in the lateral direction and the second electrical contact comprises a second plurality of fingers extending in the lateral direction interdigitated with the first plurality of fingers.

9. The photodetector of claim 7 wherein at least one of the electrical contacts forms a Schottky barrier with the thin active layer.

10. The photodetector of claim 7 wherein spacing between the contacts and thickness of the thin active layer is selected such that carrier drift time in the lateral direction between contacts is approximately equal to carrier diffusion time in the vertical direction.

11. The photodetector of claim 7 wherein the active layer thickness is about the same as the spacing between the contacts.

12. The photodetector of claim 7 wherein the thin active layer comprises silicon.

\* \* \* \* \*